United States Patent
Baumler et al.

(10) Patent No.: US 9,510,489 B2
(45) Date of Patent: Nov. 29, 2016

(54) HIGH ISOLATION GROUNDING DEVICE

(71) Applicant: Cinch Connectivity Solutions, Inc., Bannockburn, IL (US)

(72) Inventors: Robert Joseph Baumler, Waseca, MN (US); Mark Daniel Dvorak, Waseca, MN (US); James Richard Kerekes, Waterville, MN (US)

(73) Assignee: Cinch Connectivity Solutions, Inc., Bannockburn, IL (US)

( * ) Notice: Subject to any disclaimer, the term of this patent is extended or adjusted under 35 U.S.C. 154(b) by 0 days.

(21) Appl. No.: 14/627,177

(22) Filed: Feb. 20, 2015

(65) Prior Publication Data
US 2015/0245544 A1 Aug. 27, 2015

Related U.S. Application Data

(60) Provisional application No. 61/966,482, filed on Feb. 23, 2014.

(51) Int. Cl.
| | |
|---|---|
| *H05K 9/00* | (2006.01) |
| *H01R 13/03* | (2006.01) |
| *H01R 13/6594* | (2011.01) |
| *H01R 13/6598* | (2011.01) |
| *H01R 24/50* | (2011.01) |
| *H01R 103/00* | (2006.01) |

(52) U.S. Cl.
CPC ............... *H05K 9/00* (2013.01); *H01R 13/03* (2013.01); *H01R 13/6594* (2013.01); *H01R 13/6598* (2013.01); *H01R 24/50* (2013.01); *H05K 9/0066* (2013.01); *H05K 9/0086* (2013.01); *H01R 2103/00* (2013.01)

(58) Field of Classification Search
CPC ....... H05K 9/00; H01R 23/722; H01R 23/68
USPC ......................................................... 361/818
See application file for complete search history.

(56) References Cited

U.S. PATENT DOCUMENTS 4,421,371 A * 12/1983 Clark ................... H01R 13/631
439/249
4,925,403 A 5/1990 Zorzy
(Continued)

FOREIGN PATENT DOCUMENTS

DE 202007008848 U1 8/2007
EP 0339145 A1 8/2003
(Continued)

OTHER PUBLICATIONS

International Search Report for PCT/US2015/016807, May 28, 2015.
(Continued)

*Primary Examiner* — Hoa C Nguyen
*Assistant Examiner* — Stanley Tso
(74) *Attorney, Agent, or Firm* — Dentons US LLP; Brian R. McGinley; Roman Tsibulevskiy

(57) ABSTRACT

The device includes a body and a plurality of contact portions. The body is substantially planar. The plurality of contact portions are associated with the body so as to form ports. The plurality of contact portions are in electrical communication with the body. The port of each contact portion having an inside diameter substantially equal to ID1. The body and the contact portions are constructed of a conductive metallic material.

5 Claims, 9 Drawing Sheets

(56) References Cited

U.S. PATENT DOCUMENTS

| | | | |
|---|---|---|---|
| 5,769,652 A | 6/1998 | Wider | |
| 6,037,846 A | 3/2000 | Oberhammer | |
| 6,441,706 B1* | 8/2002 | Nelson | H01R 13/5205 174/99 E |
| 6,948,977 B1 | 9/2005 | Behrent | |
| 7,789,721 B1* | 9/2010 | Burdenko | H01R 13/111 439/851 |
| 7,927,125 B1* | 4/2011 | Zieman | H01R 13/73 439/347 |
| 7,934,954 B1* | 5/2011 | Chawgo | H01R 9/0524 439/578 |
| 2002/0076978 A1* | 6/2002 | Meyer | H01R 13/746 439/551 |
| 2003/0088242 A1* | 5/2003 | Prakash | A61B 18/18 606/33 |
| 2006/0096773 A1* | 5/2006 | Cochrance | H05K 9/0015 174/377 |
| 2007/0049082 A1 | 3/2007 | Wu | |
| 2007/0111596 A1* | 5/2007 | Weidner | H01R 9/0515 439/581 |
| 2013/0186874 A1* | 7/2013 | Ihde | B23K 9/323 219/137.63 |
| 2013/0252477 A1* | 9/2013 | Mcalonis | H01R 13/6453 439/680 |
| 2015/0044905 A1* | 2/2015 | Burris | H01R 9/0524 439/578 |
| 2015/0168201 A1* | 6/2015 | Cobianu | G01F 23/284 342/124 |

FOREIGN PATENT DOCUMENTS

| | | |
|---|---|---|
| JP | 4246682 | 4/2009 |
| JP | 4984896 | 7/2012 |
| KR | 101049171 | 7/2011 |
| KR | 10-1055492 | 8/2011 |

OTHER PUBLICATIONS

Written Opinion of the International Searching Authority for PCT/US2015/016807, May 28, 2015.

Supplemental Partial European Search Report for EP 13796518.2, Nov. 5, 2015.

* cited by examiner

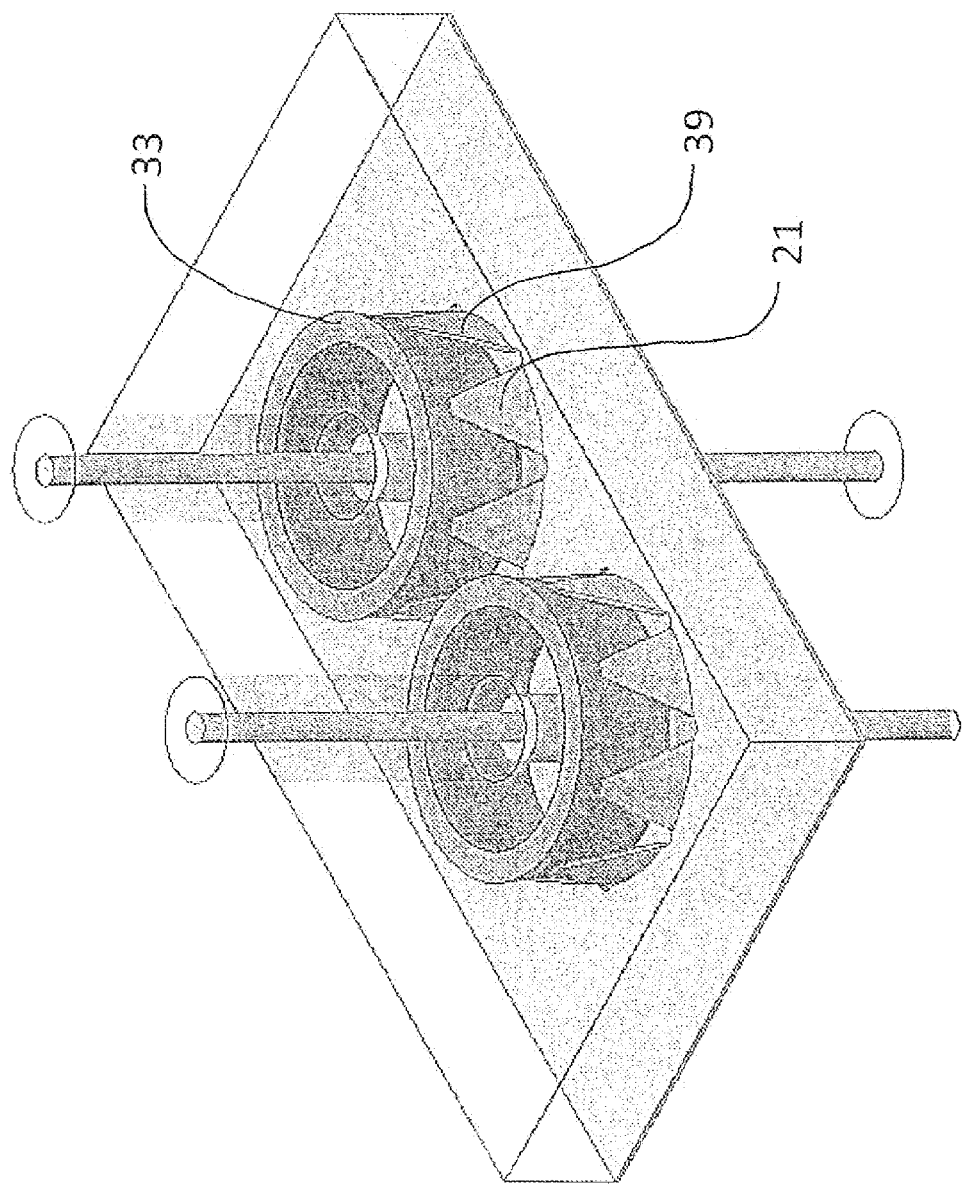

HIGH ISOLATION GROUNDING DEVICE

CROSS-REFERENCE TO RELATED APPLICATION

This application claims the benefit of, and priority to, U.S. Provisional Patent Application Ser. No. 61/966,482, entitled "High Isolation Grounding Device," filed on Feb. 23, 2014, the entire content of which is incorporated herein by reference for all purposes.

BACKGROUND OF THE INVENTION

1. Field of the Invention

The present invention pertains to devices which reduce electromagnetic interference (EMI). The invention more particularly concerns such a device which is mountable to a printed circuit board (PCB) and which is also engagable with a connector.

2. Discussion of the Background

Devices such as a gasket which is made of an elastomeric material which is impregnated with conductive material are known. Also, electrical connectors which operate in the RF spectrum are known. Typically, the gasket is mounted between the printed circuit board and the electrical connector so as to reduce the amount of electromagnetic radiation which potentially could escape somewhere between the surface of the PCB and the electrical connector. As the number of transmitted electrical signals increases the number of electrical connectors increases. However, in some applications, the amount of space available to accommodate the electrical connectors has not increased. Thus, the density per unit space of connectors is increased. The density can be increased, but the increase in density is limited by how closely the port of one coaxial conductor can be placed adjacent to the port of another coaxial conductor without there being an unacceptable amount of cross-talk or leakage of electromagnetic radiation from one port to another port. The amount of leakage becomes unacceptable when the signal being transported by one of the coaxial conductors is corrupted by the electromagnetic radiation emitted by the other coaxial conductor.

Also known in the art are ganged connectors, such as the connector disclosed in U.S. Pat. No. 7,927,125, which is hereby incorporated herein by reference. This connector has a predefined number of electrical ports that can be accommodated. If the number of desired ports exceeds the number of ports provided on the connector, then another connector must be used or a special connector must be made.

SUMMARY OF THE INVENTION

The invention provides for a device which reduces the amount of electromagnetic radiation emitted between ports of a ganged electrical connector when the ganged electrical connector is connected to a printed circuit board.

In one aspect of the present disclosure, a device is disclosed that includes a planar body, and a plurality of contact portions in electrical association with the body so as to form ports, wherein the body and the plurality of contact portions include a conductive material, e.g., aluminum, beryllium copper, or combinations thereof.

In certain embodiments, each contact portion may include at least one slot.

In certain embodiments, each contact portion may include at least one triangular-shaped section.

Each contact portion has an inside diameter (ID1) and an overall thickness (T1), and the body has an overall thickness (T2).

In certain embodiments, the overall thickness (T2) of the body may be greater than the overall thickness (T1) of each contact portion.

In another aspect of the present disclosure, a device is disclosed that includes a planar body having an overall thickness (T2), and a plurality of contact portions in electrical association with the body so as to form ports, wherein each contact portion has an overall thickness (T1).

The body and the plurality of contact portions include a conductive material, e.g., aluminum, beryllium copper, or combinations thereof.

In certain embodiments, the overall thickness (T2) of the body may be greater than the overall thickness (T1) of each contact portion, whereas in certain other embodiments, the overall thickness (T2) of the body may be equal to the overall thickness (T1) of each contact portion.

In another aspect of the present disclosure, a device is disclosed that is mountable to a printed circuit board, and engagable with a ganged connector, wherein the printed circuit board has a surface, and the ganged connector has at least one boss with a tapered outer wall.

The disclosed device includes a planar body, and a plurality of contact portions in electrical association with the body so as to form ports, wherein each contact portion has an inner wall defining an inside diameter (ID1).

The body and plurality of contact portions include a conductive material, e.g., aluminum, beryllium copper, or combinations thereof.

The device is configured and dimensioned such that, when mounted on the printed circuit board, no air pockets are formed or exist between the device and the printed circuit board.

The ganged connector is configured and dimensioned such that when the ganged connector is introduced toward the printed circuit board, the at least one boss of the ganged connector is introduced into contact with one of the plurality of contact portions. The ganged connector is further configured and dimensioned such that when the ganged connector is introduced into contact with the printed circuit board, the tapered outer wall of the boss contacts the inner wall of one of the ports so that the boss is in electrical communication with the device.

The device has a height which is less than a distance measured between the surface of the printed circuit board and a surface on the ganged connector from which the boss originates.

In certain embodiments, each contact portion may include at least one slot.

In certain embodiments, each contact portion may include at least one triangular-shaped section.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 9 is a partial perspective view of the third embodiment of the invention as it engages the ganged connector.

DETAILED DESCRIPTION OF THE PRESENTLY PREFERRED EMBODIMENTS

Figure 1:
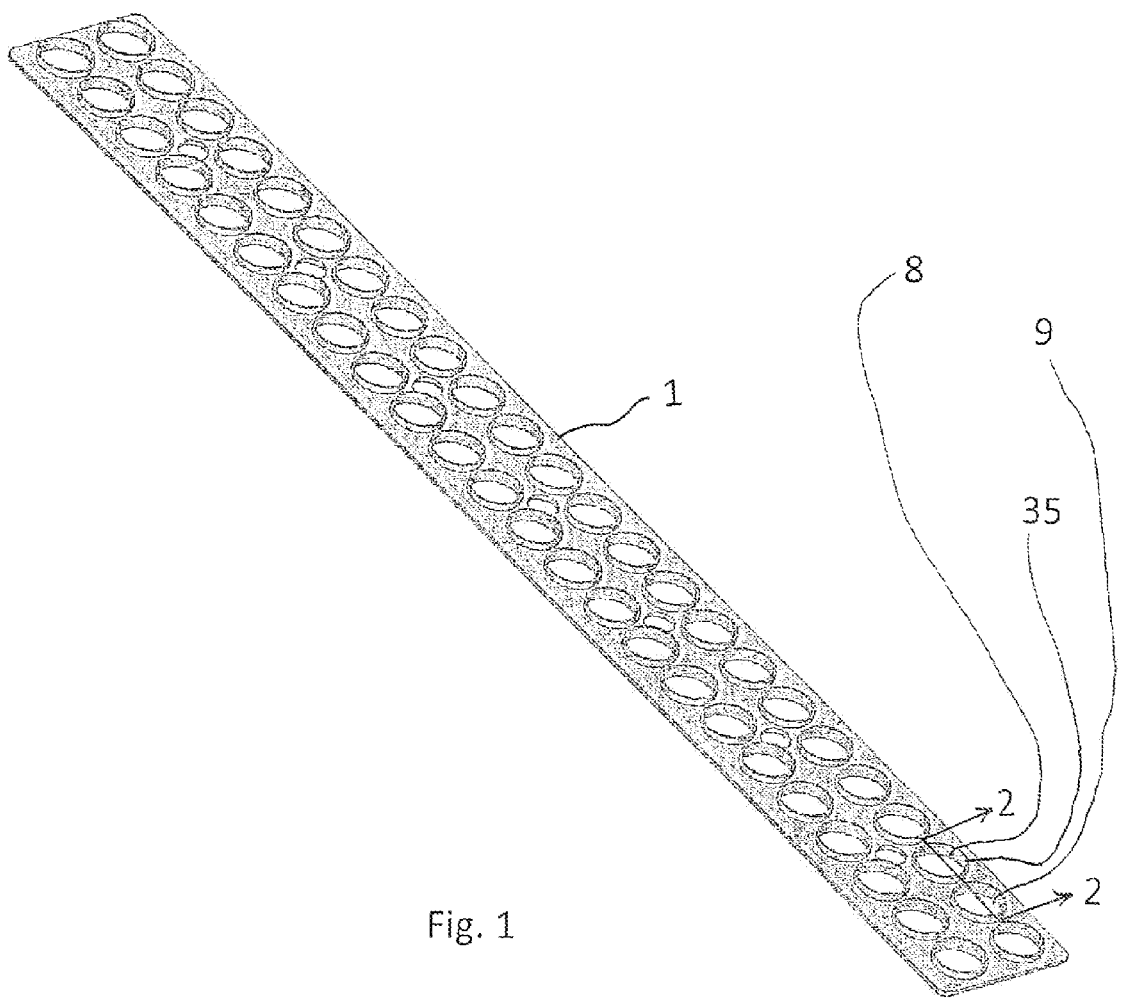
FIG. 1 is a perspective view of a first embodiment of the device of the invention.

Referring now to the drawings, wherein like reference numerals designate identical or corresponding parts through the several views, embodiments of the present invention are displayed therein.

FIG. 1 is a perspective view of the first embodiment of the device or EMI gasket 1. The EMI gasket 1 contains forty-eight ports which are arranged in two rows where each row contains twenty-four ports. A first port 8 and a second port 9 are identified. The EMI gasket 1 is constructed of a conductive metallic material such as aluminum or beryllium copper. The EMI gasket 1 includes a contact portion 35 which is shown in conjunction with port 8, but note that each port includes a contact portion. The contact portion 35 can be machined integral with the remainder of the EMI gasket 1 or the contact portions 35 can be joined to the reminder of the EMI gasket by way of welding, brazing, or other joining techniques well known in the art. The contact portion 35 is shown to have a shape of a ring or annulus.

Figure 2:
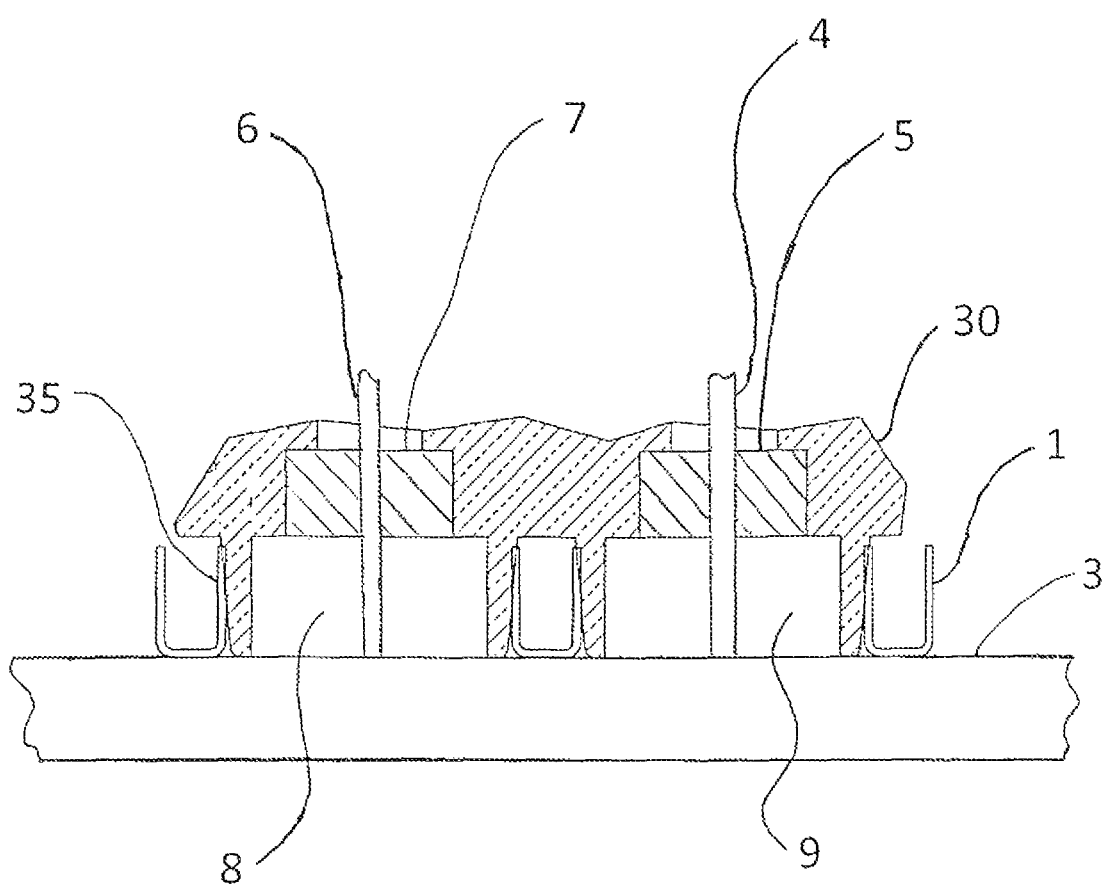
FIG. 2 is a partial cross-sectional side view of the device of FIG. 1, taken along section line 2-2, mounted between a ganged connector and a printed circuit board.

FIG. 2 is a partial cross-sectional side view of the first embodiment of the invention, taken along section line 2-2 of FIG. 1, where the EMI gasket 1 is soldered to a printed circuit board 3. The EMI gasket 1 is soldered to the printed circuit board 3 so that no air pockets are formed or exist between the EMI gasket 1 and the printed circuit board 3. The EMI gasket 1 is also shown engaged with a ganged connector 30. Further shown are a conductor 6 positioned in port 8, where the conductor 6 is separated from the conductive body of the ganged connector 30 by an insulative spacer 7. Still further shown are a conductor 4 positioned in port 9, where the conductor 4 is separated from the conductive body of the ganged connector 30 by an insulative spacer 5. The engagement of the EMI gasket 1 with the printed circuit board 3 and with the ganged connector 30 prevents an unacceptable level of electromagnetic radiation from entering one port from another port. Thus the signals being carried by conductors 4 and 6 are not corrupted. For reasons of clarity, the EMI gasket 1 is not shown as being cross-hatched, even though the component is shown in section, since the EMI gasket 1 is relatively thin as compared to the other components.

Figure 3:
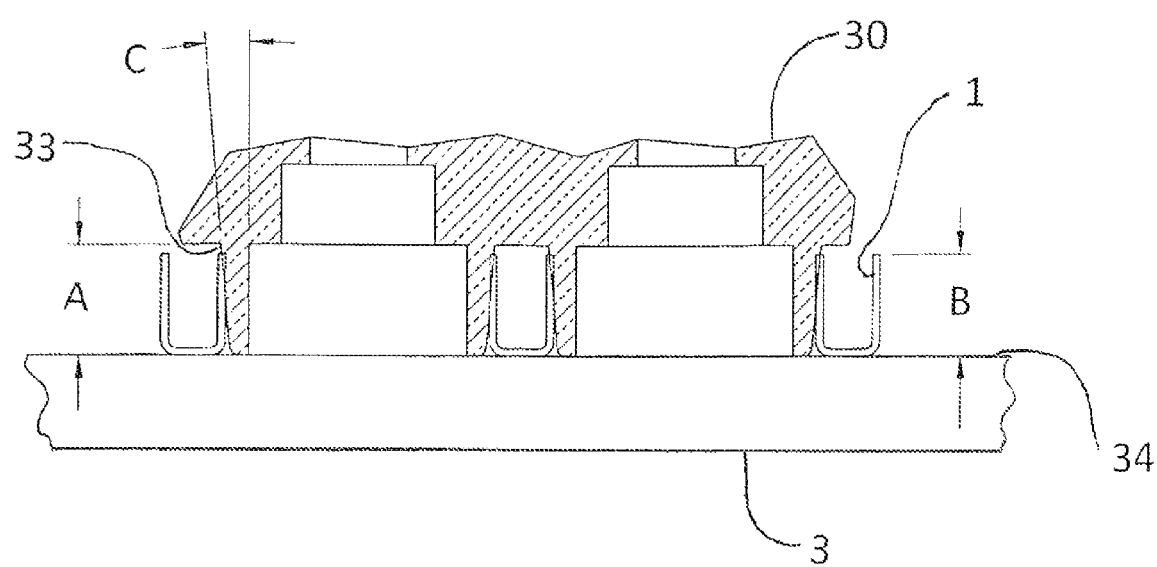
FIG. 3 is the partial cross-sectional side view of FIG. 2, minus the conductors and insulative spacers, which identifies more details of the device of FIG. 1.

FIG. 3 is the partial cross-sectional side view of FIG. 2 without conductors 4, 6 and insulative spacers 5, 7 being shown for reasons of clarity. A boss 33 is shown as projecting from the body of the ganged connector 30. The boss 33 generally has a ring or annular shape. The boss 33 of the ganged connector 30 is shown in contact with a surface 34 of the printed circuit board 3. A boss is associated with each port. The outside diameter of the boss 33 is shown to have a draft angle C. A distance A identifies the distance from the surface 34 of the printed circuit board 3 to a surface from which the boss 33 originates out of the body of the ganged connector 30 when the boss 33 contacts the surface 34 of the printed circuit board 3. A distance B identifies a height of the EMI gasket 1. Note that distance A is greater than distance B.

Figure 4:
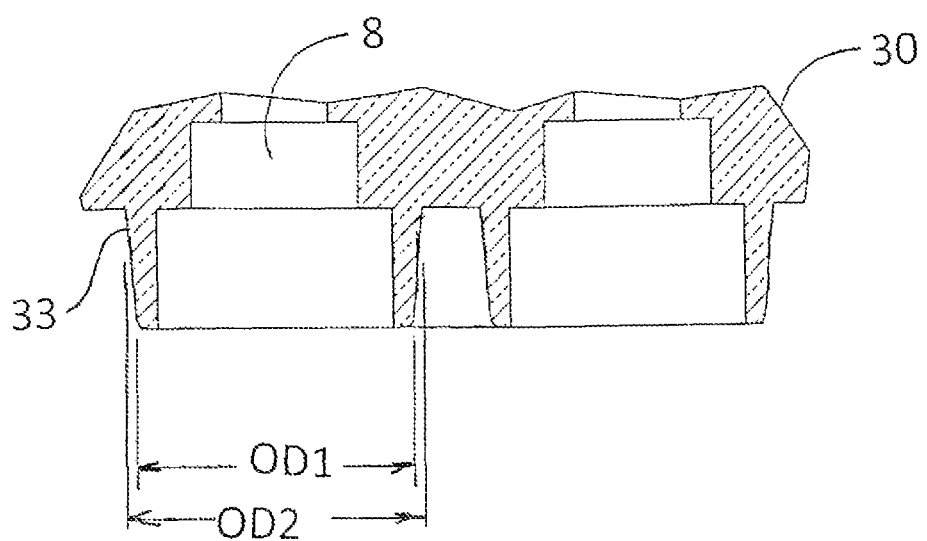
FIG. 4 is a partial cross-sectional side view of the ganged connector of FIG. 2.

FIG. 4 is a partial cross-sectional side view of the ganged connector 30 including boss 33. Identified in FIG. 4 are an outside diameter OD1 of the boss 33 and an outside diameter OD2 of the boss 33 which are associated with port 8. Note that outside diameter OD2 is greater than outside diameter OD1.

Figure 5:
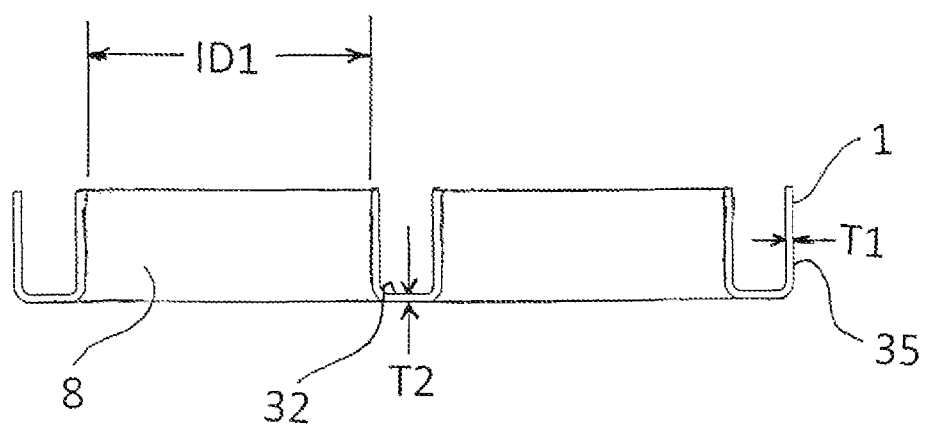
FIG. 5 is a partial cross-sectional side view of the device of the invention as taken from FIG. 2.

FIG. 5 is a partial cross-sectional side view of the EMI gasket 1. The contact portion 35 of the EMI gasket 1 includes an inside diameter ID1 associated with port 8. The insider diameter ID1 is centered about a longitudinal axis which is not shown. Each port 8 is associated with only its own respective contact portion 35. The contact portion 35 has a thickness T1 and the remainder or body 32 of the EMI gasket 1 has a thickness T2. The longitudinal axis of the inside diameter ID1 being substantially perpendicular to the planar body 32 and the longitudinal axis of the inside diameter ID1 is substantially perpendicular to the surface 34 of the printed circuit board 3 as shown in FIG. 3. The inside diameter ID1 of the EMI gasket 1 is greater than the outside diameter OD1 of the boss 33 so that the boss 33 can enter the contact portion 35 of the EMI gasket 1. The inside diameter ID1 is less than the outside diameter OD2 of boss 33. So, when the boss 33 is further introduced into the contact portion 35, the outside diameter of the boss 33 engages the contact portion 35, and when the boss 33 and hence the ganged connector 30 are further urged toward the printed circuit board 3 so that the boss 33 contacts the surface 34 of the printed circuit board 3, then a portion of the contact portion 35 is deformed to a larger diameter. Preferably the deformation is elastic. As compared to the contact portion 35, the boss 33 is substantially rigid. When the boss 33 contacts the contact portion 35, then the ganged connector 30 is in electrical communication with the EMI gasket 1, and thus the components are grounded to each other. Thickness T1 is shown as being substantially the same as thickness T2. The contact portion 35 is shown in FIG. 5 in an undeformed state.

However, note that thickness T1 need not be substantially the same as T2. Additionally, dimension B which identifies the height of the EMI gasket 1 can be substantially different than as shown in FIG. 2. If the deformation is elastic, then the gang connector 30 can be mounted and de-mounted to the EMI gasket 1 more than once. Additionally, it has been found that adequate isolation can be achieved even if the boss 33 does not contact the surface 34 of the printed circuit board 3, but it must be close. However, it is preferable that the boss 33 does contact the surface 34 of the printed circuit board 3.

Figure 6:
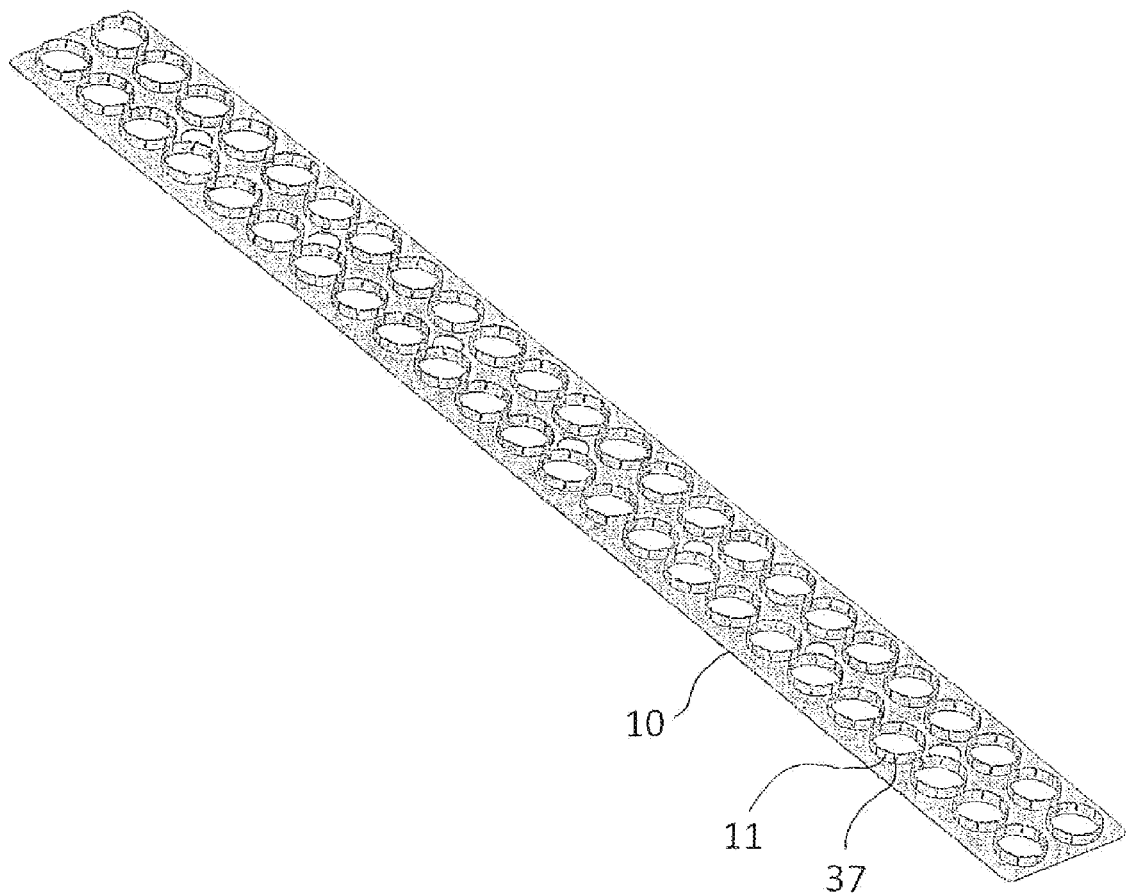
FIG. 6 is a perspective view of a second embodiment of the invention.

FIG. 6 a perspective view of a second embodiment of the invention which is an EMI gasket 10 having a contact portion 11 which includes slots 37 in the contact portion 11. Otherwise, EMI gasket 10 is substantially similar to EMI gasket 1.

Figure 7:
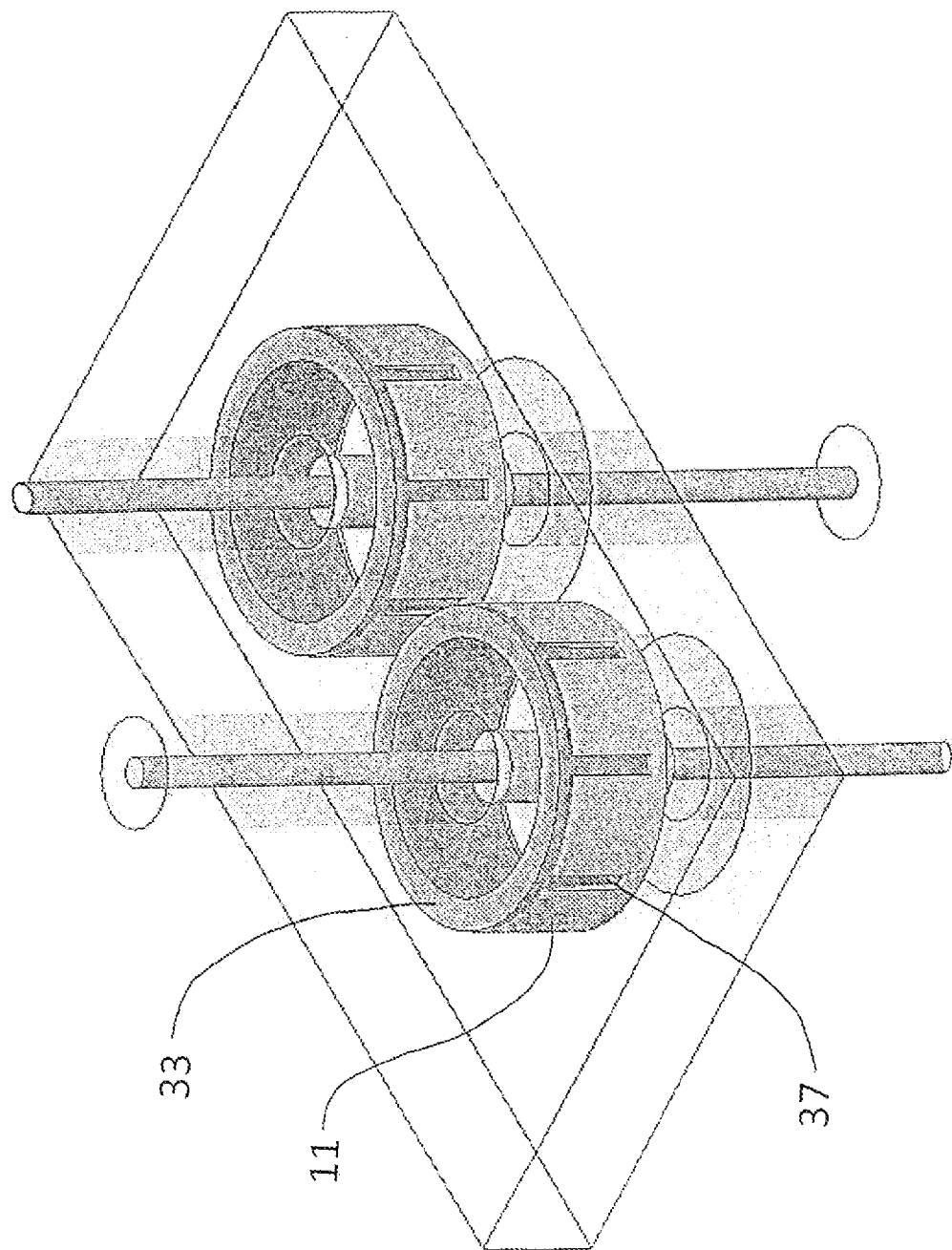
FIG. 7 is a partial perspective view of the second embodiment of the invention as it engages the ganged connector.

FIG. 7 is a partial perspective view of the contact portion 11, including the slots 37, of EMI gasket 10 engaged with boss 33. The slotted contact portion 11 allows for more flexibility of the contact portion 11 as compared to the contact portion 35 that does not include slots, yet the EMI gasket 10 still provides for adequate reduction of electromagnetic interference between adjacent ports of the ganged connector 30.

Figure 8:
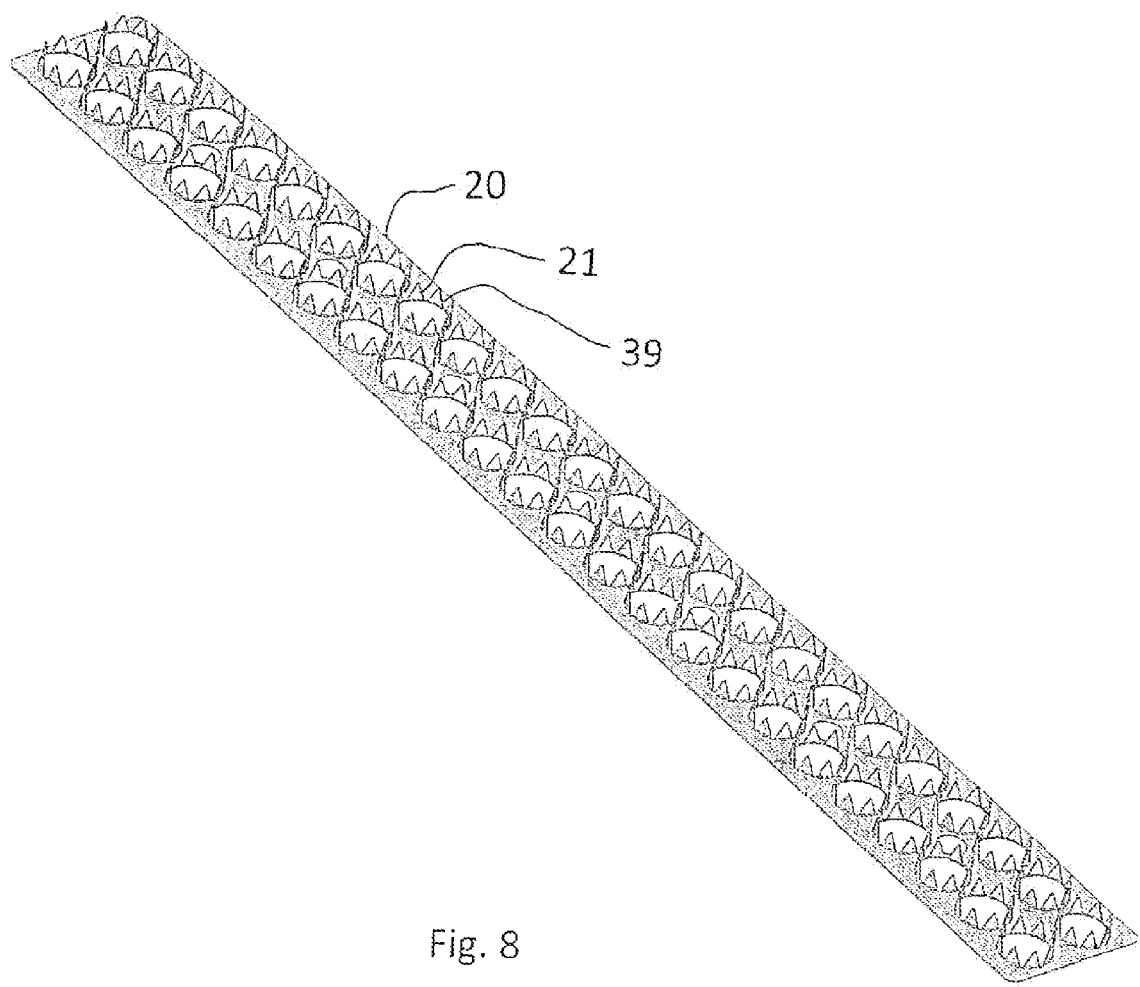
FIG. 8 is a perspective view of a third embodiment of the invention.

FIG. 8 is a perspective view of a third embodiment of the invention which is an EMI gasket 20 having a contact portion 39 which includes triangular-shaped sections 21. Otherwise, EMI gasket 20 is substantially similar to EMI gasket 1.

FIG. 9 is a partial perspective view of the contact portion 39, including the triangular-shaped sections 21, of EMI gasket 20 engaged with boss 33. The contact portion 39, including the triangular-shaped sections 21, allows for more flexibility of the contact portion 39 as compared to the contact portion 35 that does not include triangular-shaped sections, yet the EMI gasket 20 still provides for adequate reduction of electromagnetic interference between adjacent ports of the ganged connector 30.

Obviously, numerous modifications and variations of the present invention are possible in light of the above teachings. For example, persons skilled in the art will understand that additional components and features may be added to any of the embodiments discussed herein above without departing from the scope of the present disclosure. It is therefore to be understood that within the scope of appended claims, the invention may be practiced otherwise than as specifically described herein.

The scope of the present disclosure is intended to cover any variations, uses, or adaptations of the presently disclosed subject matter in accordance with the principles of the present disclosure, including such departures from the present disclosure as come within known or customary practice within the art to which the present disclosure pertains and as may be applied to the essential features herein before set forth. Further, it is envisioned that any feature described in connection with any one embodiment may also be applicable to, or combined with, any other embodiment.

The invention claimed is:

1. A gasket mountable to a printed circuit board and engagable with a ganged connector,
   the printed circuit board having a surface,
   the ganged connector having at least one boss with a tapered outer wall, the gasket comprising:
   a planar and linear body; and
   a plurality of contact portions in electrical association with the body so as to form ports,
   the plurality of contact portions each having an inner wall defining an inside diameter (ID 1) and the inside diameter having a longitudinal axis about which the inside diameter is centered and where the longitudinal axis is substantially perpendicular to the body,
   and where each contact portion of the plurality of contact portions is associated with only one respective port of the ports,
   and where, in an undeformed state of the contact portion, the inside diameter (ID 1) is substantially constant along a length of the inner wall of the contact portion,
   wherein the body and the plurality of contact portions include a conductive material, the body being configured and dimensioned such that, when the body is mounted on the printed circuit board, no air pockets are formed or exist between the body and the printed circuit board and that the longitudinal axis of the inside diameter (ID 1) of each contact portion of the plurality of contact portions is substantially perpendicular to the surface of the printed circuit board,
   the ganged connector being configured and dimensioned such that, when the ganged connector is introduced toward the printed circuit board, the at least one boss of the ganged connector is introduced into contact with one of the plurality of contact portions,
   wherein each contact portion includes a plurality of triangular-shaped sections,
   wherein each of the triangular-shaped sections extends to form a closed shape,
   the ganged connector being further configured and dimensioned such that as the ganged connector is introduced into contact with the printed circuit board, the tapered outer wall of the at least one boss contacts the inner wall of one of the ports so that the at least one boss is in electrical communication with the body,
   the body having a height which is less than a distance measured between the surface of the printed circuit board and a surface on the ganged connector from which the at least one boss originates.

2. The gasket according to claim 1, wherein the body and the plurality of contact portions include aluminum.

3. The gasket A device according to claim 1, wherein the body and the plurality of contact portions include beryllium copper.

4. The gasket according to claim 1, wherein each contact portion includes at least one slot.

5. The gasket A device according to claim 4, wherein the body and the plurality of contact portions include beryllium copper.

* * * * *